(12) United States Patent
De Huu et al.

(10) Patent No.: US 8,947,103 B2
(45) Date of Patent: Feb. 3, 2015

(54) INDUCTIVE PROXIMITY SWITCH

(75) Inventors: Marc De Huu, Murist (CH); Peter Heimlicher, Fribourg (CH)

(73) Assignee: Optosys SA (CH)

( * ) Notice: Subject to any disclaimer, the term of this patent is extended or adjusted under 35 U.S.C. 154(b) by 271 days.

(21) Appl. No.: 13/224,697

(22) Filed: Sep. 2, 2011

(65) Prior Publication Data

US 2012/0062242 A1    Mar. 15, 2012

(30) Foreign Application Priority Data

Sep. 14, 2010  (EP) .................................... 10176689

(51) Int. Cl.
*G01R 27/04* (2006.01)
*G01R 27/32* (2006.01)
*H03K 17/95* (2006.01)

(52) U.S. Cl.
CPC .................................. *H03K 17/9525* (2013.01)
USPC ............................ 324/647; 335/202; 335/205

(58) Field of Classification Search
USPC ............. 324/647, 207, 207.16, 334; 335/202, 335/205
See application file for complete search history.

(56) References Cited

U.S. PATENT DOCUMENTS

| | | | |
|---|---|---|---|
| 4,527,227 A * | 7/1985 | Koseki ............................... | 363/54 |
| 4,884,070 A * | 11/1989 | Hannaford ................. | 340/13.38 |
| 6,130,489 A * | 10/2000 | Heimlicher .................... | 307/125 |
| 6,603,306 B1 * | 8/2003 | Olsson et al. ............. | 324/207.26 |
| 2001/0052771 A1 * | 12/2001 | Jagiella ..................... | 324/207.16 |
| 2009/0203269 A1 * | 8/2009 | Jenne et al. .................... | 439/862 |

FOREIGN PATENT DOCUMENTS

| | | |
|---|---|---|
| EP | 0936739 A1 | 8/1999 |
| EP | 0936741 A1 | 8/1999 |
| EP | 0936741 A1 * | 8/1999 |
| EP | 1635146 A2 | 3/2006 |
| GB | 2040054 A | 8/1980 |

OTHER PUBLICATIONS

European Search Report dated Feb. 3, 2011, issued in corresponding priority European application No. 10176689.

* cited by examiner

*Primary Examiner* — Huy Q Phan
*Assistant Examiner* — Giovanni Astacio-Oquendo
(74) *Attorney, Agent, or Firm* — Ostrolenk Faber LLP (57) ABSTRACT

An inductive proximity switch for detecting the presence of an object in a monitored area includes a coil (2), a pulse source (4) for supplying the coil (2) with transmitting current pulses (S1, S2, S3) at a period (T) larger than the duration (Ts) of the transmitting current pulses, and a processing circuit (6) for generating an output signal (9) based on received voltages (Ui1, Ui2, Ui3) varying in dependence of a change of position of the object. The received voltages are induced in the coil (2) after the duration (Ts) of a transmitting current pulse by the decaying current which previously flows in the object due to the voltage induced therein by the coil. The proximity switch has a suppression circuit (13, 13a, 13b, 13c) for suppressing a signal duration lower than a predetermined perturbation time (Tc1, Tc2) in the output signal (9).

10 Claims, 5 Drawing Sheets

INDUCTIVE PROXIMITY SWITCH

FIELD OF THE INVENTION

The invention relates to an inductive proximity switch for detecting the presence of an object in a monitored area, comprising a coil, a pulse source for supplying said coil with transmitting current pulses at a period larger than the duration of said transmitting current pulses, and a processing circuit for generating an output signal based on received voltages varying in dependence of a change of position of the object, said received voltages being induced in said coil after the duration of a transmitting current pulse by the decaying current which previously flows in the object due to the voltage induced therein by said coil. The invention further relates to an arrangement and use of such a proximity switch in conjunction with a perturbation source.

BACKGROUND OF THE INVENTION

An inductive proximity switch of that type is described in European patent applications no. EP 0 936 739 A1 and EP 0 936 741 A1. In that proximity switch, a coil is supplied with periodical transmitting current pulses with a period exceeding the pulse length. By means of these transmitting current pulses, a voltage is periodically induced in an object to be detected. In turn, a voltage is induced in the coil subsequently after the end of a transmitting current pulse by means of the decaying current that flows in the object due to the voltage previously induced therein. The useful signal is then obtained by a suitable electronic circuit which responds to the voltage that is received by the coil in such a manner.

A disadvantage of the proximity switch is that its magnetic circuit is prone to couple with perturbing fields from the environment. Depending on the frequency band, the interaction of the proximity switch with external fields can downgrade or destruct its measuring performance. For instance, external fields in the lower frequency range up to 500 Hz and in the medium frequency range up to 10 kHz are often present in favored application areas of such a proximity switch. Most critical are external fields within the frequency band of the signal to be detected and amplified by the electronic circuit of the proximity switch—typically in the lower and/or medium frequency range—and an elimination of these perturbations is essential for the basic functionality of the proximity switch. More generally, an elimination of perturbations over the whole frequency spectrum is highly desirable for yielding an output signal of good quality.

The impact of external fields may be partially or fully suppressed—primarily at the lower frequency range—by providing the transmitting current pulses with a periodically reversed polarity, as described in European patent application no. EP 0 936 739 A1. In this approach, however, perturbing fields with larger amplitudes or frequencies in the medium or higher frequency range may not be fully eliminated by the polarity reversal.

OBJECTS AND SUMMARY OF THE INVENTION

It is therefore an object of the present invention to avoid at least one of the above mentioned disadvantages and to propose a proximity switch pertaining in the initially mentioned technical field, which is adapted to generate an output signal that is less sensitive to external perturbing fields.

Accordingly, the invention suggests that a suppression circuit is provided for suppressing a signal duration lower than a predetermined perturbation time in the output signal such that the minimum time interval between two variations of the output signal does not go below this perturbation time.

Thus, the invention proposes to adopt a perturbation time in a suppression circuit serving as an additional fixed time parameter supplementary to the fixed time period of the transmitting current pulses in order to produce an advantageous output signal of the proximity switch. According to the invention, the combined application of these two time parameters yields an effective setting option on the one hand for achieving a desired insensitivity to environmental perturbing fields and on the other hand for providing a desired degree of sensitivity for the detection of the momentary position of the monitored object. The invention has been carried out in particular in view of the realization that an adjustment of the periodic time interval of the transmitting current pulses as the only adjustable parameter may lead to an undesirable trade-off between measurement accuracy and perturbation insensitivity. This trade-off can be substantially reduced by the proposed combination of at least two adjustable time parameters according to the invention. Advantageously, the duration of the transmitting current pulses may be additionally matched in order to optimize the detection sensitivity and perturbation insensitivity.

Moreover, it has been surprisingly found that an advantageous choice of a predetermined value of said perturbation time may allow an effective elimination of external perturbation effects over a large frequency range or substantially over the whole frequency spectrum. Preferably, the perturbation time is fixed to be at least 0.1 ms, more preferred at least 1 ms and most preferred at least 10 ms. In this way, substantially the complete lower and medium frequency ranges may be accounted for by means of said suppression circuit. It has also been realized during the present invention that perturbations at a higher frequency range, in particular above 100 kHz, may be intrinsically attenuated by the electronic circuit of the proximity switch. Thus, essentially the whole frequency spectrum may be accounted for within the electronic circuit of the proximity switch by implementing the proposed predetermined value of said perturbation time in the suppression circuit. A value of at least 0.1 ms of the perturbation time may be particularly chosen for applications in which a selected suppression of prominent perturbations within the medium frequency regime shall be effectuated. On the contrary, a value of at least 1 ms may be more universally applicable and more efficient in terms of the suppression frequency range. More specifically, a value of at least 10 ms of the perturbation time can be especially advantageous for applications in which a plurality of perturbations within the lower and medium frequency ranges must be accounted for.

Preferably, the upper limit for the fixed value of the perturbation time is chosen with regard to an expected movement behavior of the monitored object in order to achieve a sufficiently fast response time in the output signal. Advantageously, the perturbation time may be at most 1 s, more preferred at most 100 ms and most preferred at most 50 ms. In particular, a value of 100 ms or below generally yields good results with respect to the time response of the proximity switch in various applications.

For example, a value of the perturbation time in between 10 ms and 100 ms has been found to produce an output signal of a high quality by maintaining the above mentioned advantages in certain applications, such as electric resistance welding. Moreover, a value of at least 20 ms of the perturbation time may be chosen in particular for specifically problematic applications, such as electric resistance welding at a medium frequency, in order to efficiently suppress an entire ensemble of occurring perturbations and still ensure the desired detection sensitivity.

Preferably, the processing circuit is configured to generate an intermediate signal comprising two signal states and to feed the intermediate signal to the suppression circuit to generate the output signal. In this way, an easier treatability of the intermediate signal that is preprocessed in such a manner can be exploited and the design of the suppression circuit may be simplified. Thus, an implementation of a more complex filtering circuit that would be necessary directly at the entrance of the measured signal can be avoided. For instance, a comparator circuit may be applied in order to provide the intermediate signal.

Preferably, the first signal state of the intermediate signal indicates the absence of the object from the monitored area and the second signal state indicates the presence of the object within the monitored area. Preferably, the two signal states of the intermediate signal are distinguished in the suppression circuit by means of at least two switching states, more preferred at least four switching states. The switching states may be defined by a switching circuit comprising respective switches. In order to minimize the design complexity and fabrication expense of the electronic circuit, at least two of the switching states are preferably integrated in a single switching unit, such as a multiplexer and/or a flip-flop or the like. More generally, the switching circuit is preferably configured to allow a distinguished treatment of said signal states in the suppression circuit. For instance, the switching circuit may also be constituted by a processing unit, wherein the switching states may be realized by a conditional programming code. Preferably, the suppression circuit further comprises at least one delay circuit for delaying the intermediate signal by the duration of said perturbation time for each of said signal states.

The described suppression circuit of the proximity switch allows a complete suppression of undesired frequencies in the output signal ranging below said predetermined perturbation time. It is therefore superior as compared to a conventional low pass filter which generally only allows a signal attenuation beyond a certain cut-off frequency.

According to a first embodiment of the suppression circuit, the same value of said perturbation time is applied for each of the two signal states. According to a second embodiment, a different value of the perturbation time is applied in the suppression circuit for the two signal states. Preferably, the different values of the perturbation time for the two signal states are fixed by means of at least one diode in the suppression circuit. The usage of the same value or different values of the perturbation time may be determined in dependence of the desired application of the proximity switch and the properties of perturbing fields.

Preferably, in order to implement an easy design of the suppression circuit, the suppression circuit comprises at least one RC member with components determining said perturbation time. In particular, the elementary design of the suppression circuit may comprise a monostable multivibrator. Preferably, the monostable multivibrator is retriggerable in order to further improve the response behavior of the output signal.

Preferably, the polarity is reversed during a sequence of the transmitting current pulses. The sequence of the transmitting current pulses preferably comprises a preceding current pulse and a succeeding current pulse, wherein the polarity of the succeeding current pulse is reversed with respect to the polarity of the preceding current pulse. Preferably, this is achieved by a corresponding polarity reversal in a sequence of the voltage pulses that are applied to the coil. In this way, the impact of perturbing fields, in particular in the lower frequency range, can be reduced already at the entrance level of the signal to be measured such that the effect of the suppression circuit of providing an unperturbed output signal may be enhanced. Thus, a polarity reversal in between a sequence of transmitting current pulses within a predetermined time period may be used as an additional adjustable parameter in order to optimize the detection sensitivity and perturbation insensitivity of the output signal of the proximity switch.

Preferably, said coil, said pulse source, said processing circuit and said suppression circuit are arranged in a housing being made of a metal which is not ferromagnetic and which has a specific electric resistance higher than aluminium. More preferred, said metal comprises stainless steel. In this way, the robustness of the proximity switch can be improved such that the electronic components located therein are well protected.

A preferred arrangement of the proximity switch may comprise a perturbation source that is adapted to produce a perturbation signal with a frequency of at most 50 kHz. The perturbation source may also comprise or consist of a direct current (DC) source, since for instance interruptions or switch-on operations of such a DC source can also produce perturbing fields. According to a preferred use of the proximity switch, the proximity switch is applied in electric resistance welding. During such a welding process, perturbing fields with comparatively large amplitudes are produced such that an application of the described proximity switch appears particularly advantageous.

The most common types of electric resistance welding include resistance welding at a lower frequency of 50 Hz and at a medium frequency of 1 kHz which is subsequently commutated to a frequency of 2 kHz. Thus, perturbing fields with a frequency of 50 Hz are mostly produced during the resistance welding technique at the lower frequency. In contrast, resistance welding at the medium frequency produces perturbations with a fundamental frequency of 2 kHz and furthermore a distinctive series of higher harmonics. According to the invention, the described proximity switch may be used in the vicinity of both of these welding processes.

BRIEF DESCRIPTION OF THE DRAWINGS

The invention will be described in more detail in the following description of a preferred exemplary embodiment with reference to the accompanying drawings. In the drawings.

DETAILED DESCRIPTION OF PREFERRED EMBODIMENTS

Figure 1:
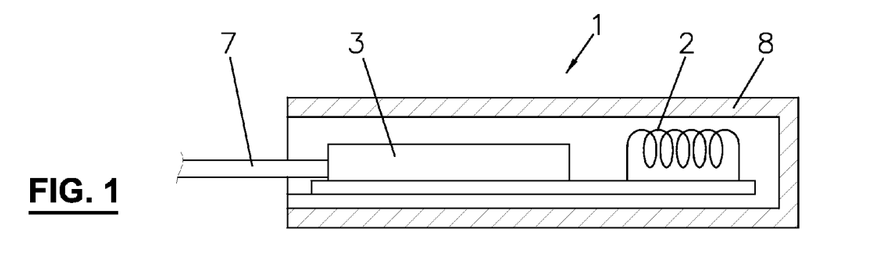
FIG. 1 is a schematic cross-section of an inductive proximity switch.
Figure 3:
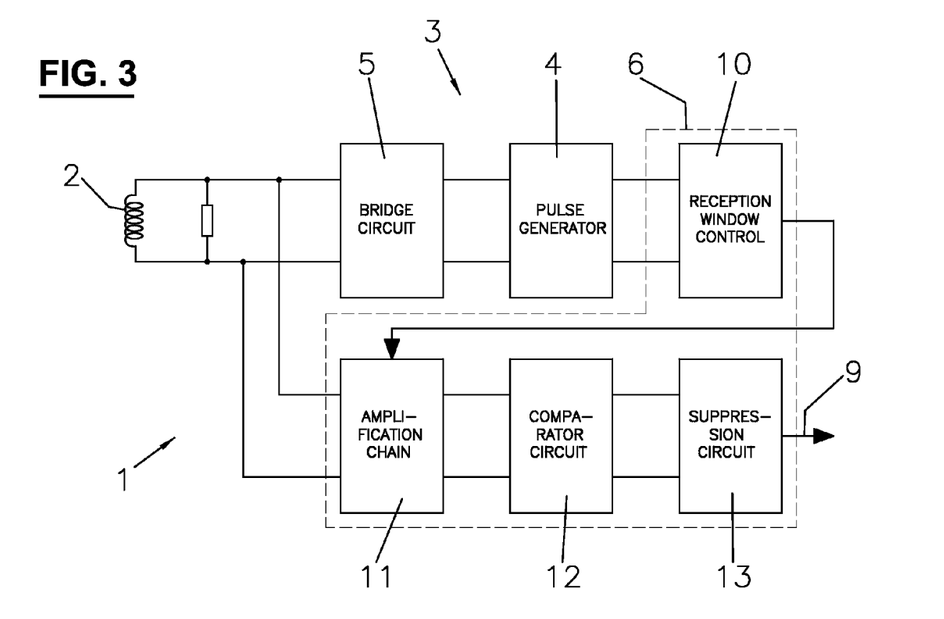
FIG. 3 is a block diagram of the electronic circuitry of the proximity switch shown in FIG. 1.

FIG. 1 shows an inductive proximity switch 1 comprising a coil 2 connected to an electronic circuit 3. The basic measurement principle of proximity switch 1 is disclosed in European patent applications no. EP 0 936 739 A1 and EP 0 936 741 A1 which are herewith included by reference. As best seen in FIG. 3, the electronic circuit 3 includes a pulse source 4 for supplying coil 2 with periodic transmitting current pulses, a bridge circuit 5 and a processing circuit 6 for generating an output signal 9 in dependence of a change of position of a monitored object. Referring again to FIG. 1, the electronic circuit 3 is connected to a cable 7 which serves for transmission of the output signal 9. The coil 2 and the electronic circuit 3 are arranged in a housing 8 consisting of a single piece of stainless steel which is not ferromagnetic and substantially has a cylindrical shape.

Figure 2A:
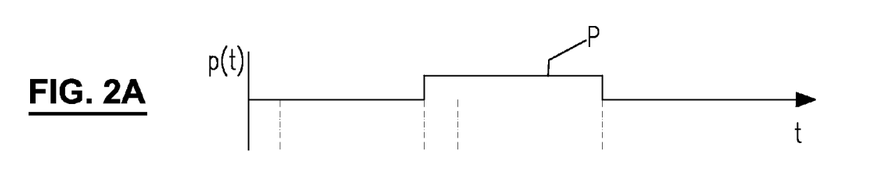
FIG. 2A-2D are diagrams of signals at the entrance of the electronic circuitry of the proximity switch shown in FIG. 1 illustrating its basic measurement principle.
Figure 2B:
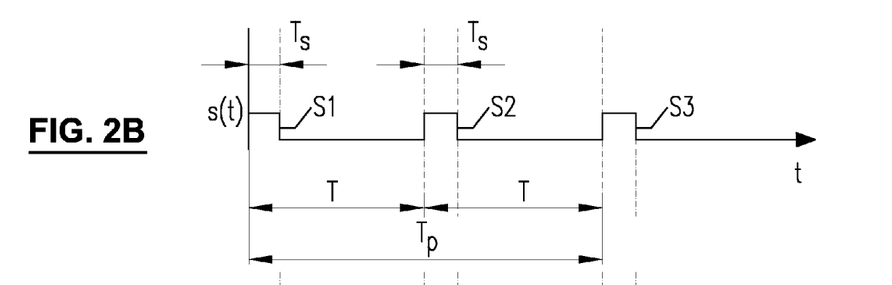

FIGS. 2A and 2B depict control signals supplied by the pulse source 4. Control signal p(t) shown in FIG. 2A controls the polarity of the D.C. voltage applied to coil 2. Control signal s(t) shown in FIG. 2B is composed of periodical pulses S1, S2, S3 with a period T that is larger as the respective pulse length Ts. For instance, the period T of pulses S1, S2, S3 may be in the range of 0.1 ms, wherein the respective pulse length Ts may roughly correspond to one fifth of this period T. The period Tp of control signal p(t) corresponds to the double period T of pulses S1, S2, S3.

Figure 2C:
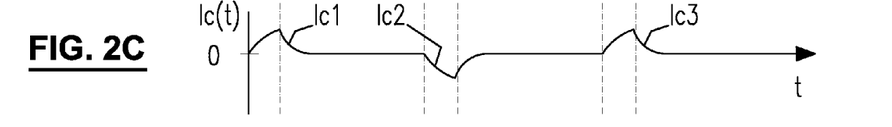

FIG. 2C depicts the current Ic(t) flowing through coil 2. Corresponding to the periodical pulses S1, S2, S3 of control signal s(t), transmitting current pulses Ic1, Ic2, Ic3 are present at each period T with an increasing amplitude during the respective pulse durations Is and a subsequently more rapidly decaying amplitude. Due to the polarity inversion governed by control signal p(t), the second current pulse Ic2 has an opposite sign as compared to the preceding and subsequent current pulse Ic1, Ic3. In this way, the impact of interferences with external low-frequency fields may be reduced, as described in more detail in European patent application no. EP 0 936 739 A1.

When a monitored object is in the zone of influence of the variable magnetic field that is generated in coil 2 by the transmitting current pulses Ic1, Ic2, Ic3, voltages are induced in the object leading to a decaying current flowing in the object.

Figure 2D:
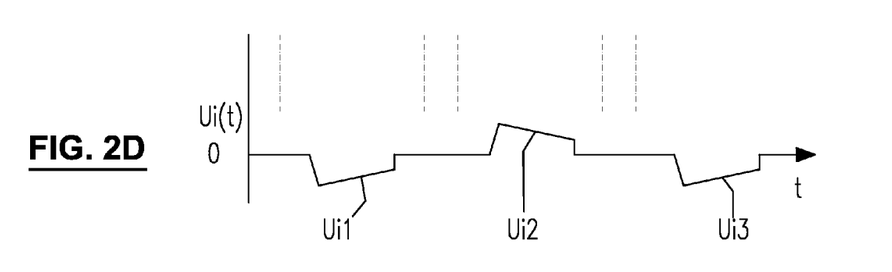

FIG. 2D represents the received voltage Ui(t) that in return is induced in coil 2 due to the magnetic coupling with the decaying current in the monitored object. Each of the transmitting current pulses Ic1, Ic2, Ic3 causes a temporally shifted received voltage pulse Ui1, Ui2, Ui3. The received voltages Ui1, Ui2, Ui3 represent a measured signal forming a basis for the output signal 9 to be generated in the processing circuit 6. The received voltages Ui1, Ui2, Ui3 typically exhibit a signal strength of approximately 100 µV to 300 µV and cover a bandwith ranging from 1 kHz to 100 kHz.

As shown in FIG. 3 in a schematic manner, the processing circuit 6 of proximity switch 1 comprises a reception window control 10, an amplification chain 11, a comparator circuit 12 and a suppression circuit 13. Reception window control 10 is primarily used for controlling the temporal position and duration of the received voltages Ui1, Ui1, Ui3 to be measured. The measured signals are then amplified at the amplifier stages 11 and further processed by means of comparator circuit 12. In this way, an intermediate signal 19 is provided at the input of suppression circuit 13 in digital form indicating the absence or the presence of the monitored object with respect to the monitored area.

Figure 4:
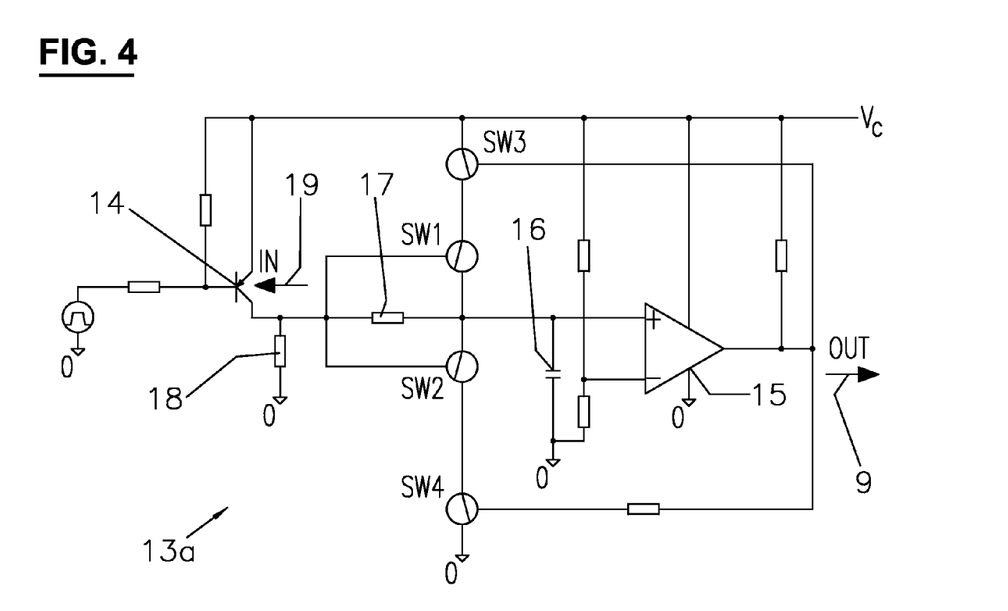
FIG. 4 is a basic circuit diagram of the suppression circuit of the electronic circuitry shown in FIG. 3 according to a first embodiment of the invention.

FIG. 4 depicts a first embodiment of a circuit diagram 13a of suppression circuit 13. The basic functionality of circuit 13a corresponds to a retriggerable monostable multivibrator. The intermediate signal 19 is delivered to the input of suppression circuit 13a at the position of transistor 14. The output signal 9 of suppression circuit 13a is provided at the output of comparator 15. Furthermore, four switches SW1, SW2, SW3, SW4 are provided in the suppression circuit 13a. In this way, a switching circuit is constituted to allow a distinguished treatment in dependence of the momentary signal state of the intermediate signal 19. Switches SW1 and SW3 are of the type normally open (NO). Switches SW2 and SW4 are of the type normally closed (NC). Thus, the switches SW3 and SW4 are used to memorize the previous state of intermediate signal 19 when a change of the signal state occurs at the input at transistor 14.

A predetermined perturbation time Tc1, Tc2 is fixed to be 25 ms in terms of the charging time of RC-member 16. This allows to distinguish four different switching states in suppression circuit 13a that can be stored by means of the switches SW1, SW2, SW3, SW4. The first switching state corresponds to a charging period Tc1 of RC-member 16. The second switching state corresponds to a decharging period Tc2 of RC-member 16. The third switching state corresponds to the potential Vc being applied to the capacitance of RC-member 16. The forth switching state corresponds to the capacitance of RC-member 16 being at ground.

In the circuit 13 shown in FIG. 4, the perturbation time Tc1, Tc2 is chosen to be equal for both signal states of the intermediate signal 19.

Figure 5:
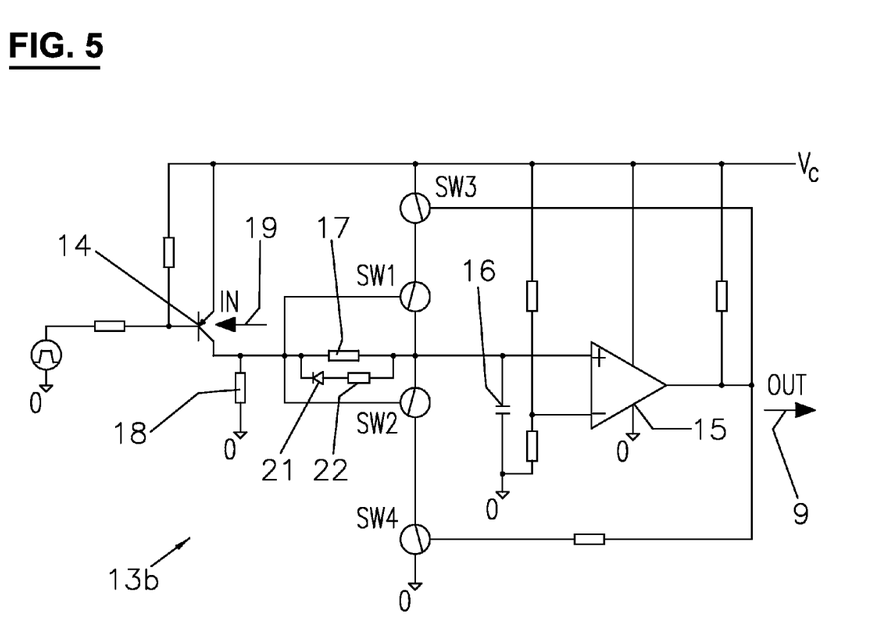
FIG. 5 is a basic circuit diagram of the suppression circuit of the electronic circuitry shown in FIG. 3 according to a second embodiment of the invention.

According to a different embodiment of the circuit 13, a different value of a perturbation time Tc1 may be chosen for the first signal state as compared to the perturbation time Tc2 of the second signal state. This can be achieved for instance as depicted in FIG. 5. The embodiment of the suppression circuit 13b shown in FIG. 5 corresponds to the one of suppression circuit 13a shown in FIG. 4 with the difference that a resistance 22 and a diode 21 are connected in parallel with the resistance 17 of suppression circuit 13b. In this way, the electrical characteristics of these two components 21, 22 determines the difference between the two perturbation times Tc1, Tc2.

Figure 6A:
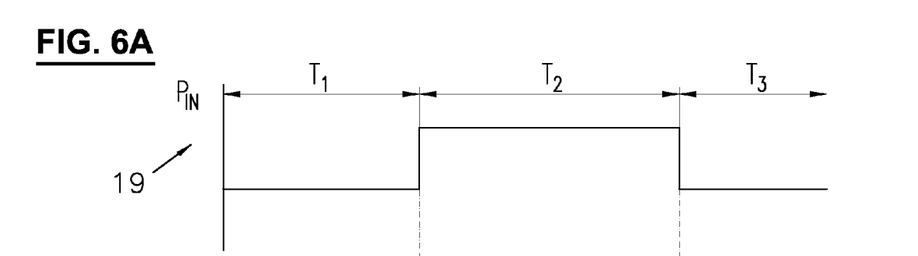
FIG. 6A, 6B are diagrams of an input signal and output signal of the suppression circuit shown in FIG. 4 in the absence of external perturbations.
Figure 6B:
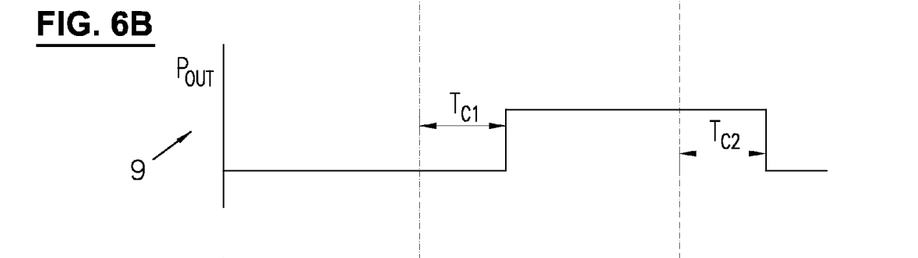

FIGS. 6A and 6B depict diagrams of the intermediate signal 19 and the output signal 9 of suppression circuit 13 in the absence of external perturbations. The intermediate signal 19 shown in FIG. 6A is set to be in the first signal state during the time periods T1 and T3 indicating that the monitored object is located outside of the monitored area. During the time period T2 in between, the intermediate signal 19 is set to be in the second signal state indicating that the monitored object is found to be inside the monitored area. The corresponding output signal 9 shown in FIG. 6B coincides with the intermediate signal 19 with two exceptions: Firstly, the transition from the first signal state to the second signal state after period T1 is delayed by the duration of perturbation time Tc1.

Secondly, the transition from the second signal state to the first signal state after period T2 is delayed by the duration of perturbation time Tc2.

Subsequently, the mode of operation of suppression circuit 13 is exemplified on the basis of the input signal 19 shown in FIG. 6A. During the period T1, the input at transistor 14 and the output at comparator 9 is set to zero voltage. At the end of period T1, a change of the signal appears from the first state to the second state at transistor 14 such that switch SW2 opens and switch SW1 closes. Switches SW3 and SW4 stay in their current switching state. As a consequence, the capacitance of RC-member 16 starts being charged. The duration of the signal being in the first state during period T2 exceeds the charging time corresponding to perturbation time Tc1. Thus, the comparator 15 tilts over and inverts the switching state of switches SW3 and SW4. In this way, the potential Vc is applied to the capacitance of RC-member 16.

The situation is inverted at the end of period T2, when a change of the signal appears from the second state to the first state at transistor 14 such that switch SW1 blocks and switch SW2 is conductive. Switches SW3 and SW4 stay in their current switching state. As a consequence, the capacitance of RC-member 16 starts being discharged via resistance 18. Since the decharging time is sufficiently long, i.e. exceeding the perturbation time Tc2, the comparator 15 tilts over and inverts the switching state of switches SW3 and SW4. In this way, the capacitance of RC-member 16 is connected to ground.

Figure 6C:
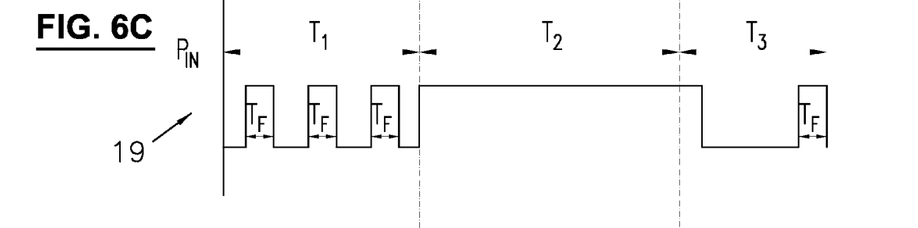
FIG. 6C, 6D are diagrams of an input signal and output signal of the suppression circuit shown in FIG. 4 in the presence of external perturbations.

FIG. 6C depicts a diagram of the intermediate signal 19 of suppression circuit 13 in the presence of external perturbations. The signal 19 of FIG. 6C corresponds to the intermediate signal 19 shown in FIG. 6A, wherein the external perturbations give rise to additional signal variations in between the first and second state during the periods T1 and T3. However, each of the additional signal variations has a duration Tf substantially smaller as compared to the perturbation time Tc1, Tc2. Thus, the charging time of the capacitance of RC-member 16 is not sufficient during the periods Tf for achieving a tilt over of comparator 15. Thus, the input voltage is returned to zero voltage and switch SW2 conducts, such that the capacitance of RC-member 16 is again connected to ground.

Figure 6D:
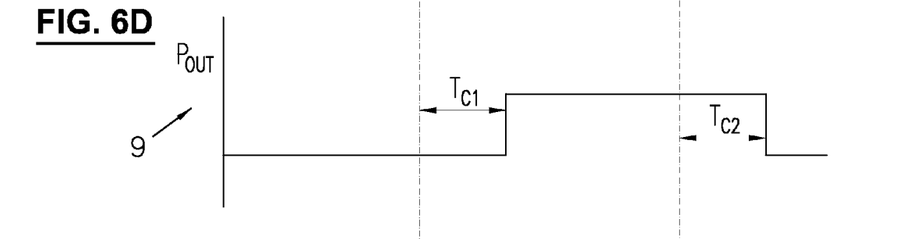

FIG. 6D depicts the corresponding diagram of the output signal 9 in the presence of the external perturbations shown in FIG. 6C. As can be seen, the additional signal variations of the intermediate signal stemming from the perturbing fields are efficiently suppressed by means of the suppression circuit 13. In this way, the minimum time interval between two variations of the output signal 9 cannot go below the respective perturbation time Tc1, Tc2.

Figure 6E:
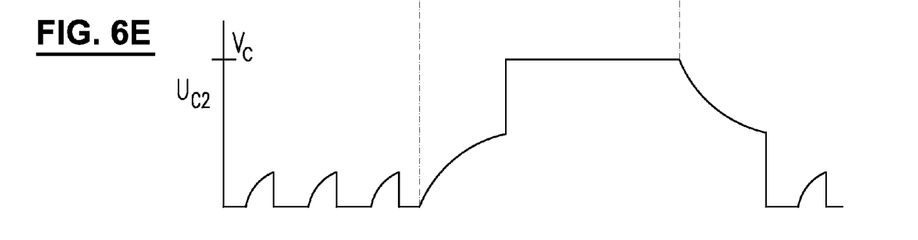
FIG. 6E is an idealized diagram of the voltage behavior on a capacitance of the suppression circuit shown in FIG. 4 corresponding to the input signal and output signal shown in FIGS. 6C and 6D.

The functionality of suppression circuits 13, 13a, 13b is further illustrated in FIG. 6E depicting the voltage behavior of the capacitance of RC-member 16 in the case of the perturbed input signal on transistor 14 as shown in FIG. 6C. During period T1, each of the signal variations with duration Tf lead to an increasing voltage at the capacitance. However, since the time of charging the capacitance is substantially smaller than the perturbation time Tc1 the system returns each time to its initial state before a state reversal by means of a tilt over of comparator 15 can occur.

The situation changes at the end of period T1, when the signal variation exceeds the value of perturbation time Tc1. Hence, the capacitance of RC-member 16 gets fully charged by the potential Vc after the tilt over of comparator 15.

Figure 7:
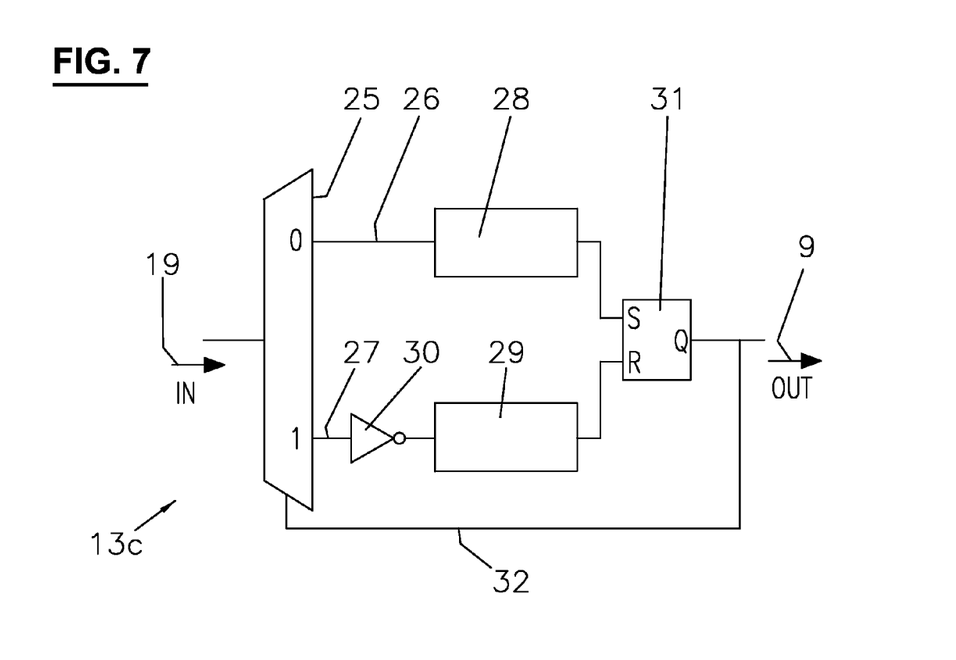
FIG. 7 is a basic circuit diagram of the suppression circuit of the electronic circuitry shown in FIG. 3 in a more general representation as compared to the circuit diagrams shown in FIGS. 4 and 5.

FIG. 7 depicts a more general representation of the detailed circuit diagrams 13a and 13b of the suppression circuit 13 of the proximity switch 1 shown in FIG. 3. The suppression circuit 13c comprises a multiplexer 25 which is connected to the output of comparator circuit 12 and comprises switches to distinguish in between the two signal states of intermediate signal 19. Accordingly, the functionality of the multiplexer 25 is provided by the switches SW1, SW2 of the more detailed suppression circuits 13a, 13b. Thus, the switching state of multiplexer 25 depends on the momentary signal state of intermediate signal 19. Depending on the momentary signal state, the intermediate signal 19 either passes through a first signal line 26 for the signal in the first signal state or a second signal line 27 for the signal in the second signal state.

Each of the signal lines 26, 27 is provided with a delay circuit 28, 29. The delay circuit 29 of the second signal line 27 is provided with an inverter in order to take into account a reversed signal of the second signal state. The delay circuits 28, 29 cause a temporal delay during which a signal must be present at the respective input of the delay circuits 28, 29 in order to allow a change of the signal to be present at the output of the delay circuits 28, 29. The temporal delay is fixed in the delay circuits 28, 29 as the value of the perturbation time Tc1, Tc2, respectively. Thus, the delay circuits 28, 29 correspond to the functionality of RC member 16 of the previously described suppression circuits 13a, 13b.

A flip-flop 31 is connected to the output of the delay circuits 28, 29 at the end of the signal lines 26, 27. The two switches of the flip-flop 31 are used to memorize the previous state of intermediate signal 19 when a change of the signal state occurs at the input. This functionality is realized by the switches SW3, SW4 of the previously described suppression circuits 13a, 13b. At the output of flip-flop 31 the output signal 9 is provided. Moreover, the output of flip-flop 31 is connected to multiplexer 25 via a signal line 32 in order to allow a change of the switching position of the multiplexer 25 depending on the momentary signal state.

Figure 8A:
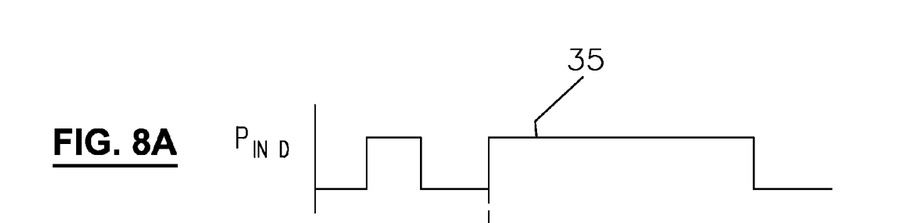
FIG. 8A, 8B are diagrams of an input signal and output signal of a delay circuit in the suppression circuit shown in FIG. 7.
Figure 8B:
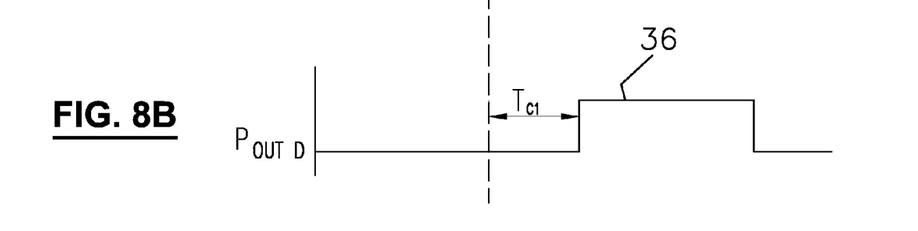

FIGS. 8A, 8B further illustrate the basic functionality of delay circuits 28, 29 using the example of delay circuit 28 of the first signal line 26. FIG. 8A shows the time evolution of a signal 35 at the input of delay circuit 28. FIG. 8B depicts the corresponding signal 36 at the output of delay circuit 28. During the initial phase, a first transition from the first signal state to the second signal state occurs in the input signal 35. The signal duration in the second signal state, however, is smaller as compared to the value of the perturbation time Tc1. Thus, the pulse length within the second signal state is completely suppressed by delay circuit 28 and no change occurs in the output signal 36 of delay circuit 28. During a subsequent phase of the input signal 35, a second transition from the first signal state to the second signal state occurs, with a duration that is substantially longer as compared to the perturbation time Tc1. In consequence, a change of the output signal 36 of delay circuit 28 occurs which can be attributed to this state transition and which is delayed by the value of perturbation time Tc1.

Thus, the mode of operation of suppression circuits 13a, 13b and 13c is equivalent, as described above with respect to the examplary signals shown in FIGS. 6A-6E. For instance, the input signal 19 shown in FIG. 6C may be taken as an specific example to further illustrate the mode of operation of suppression circuit 13c: During the short signal variations in period T1 of input signal 19, no change of the output signal 9 occurs, as shown in FIG. 6D. The reason is that the duration of these signal variations is shorter than the temporal delay Tc1 that is fixed by the respective delay circuit 28 of suppression circuit 13c.

The length of the signal during period T2 is substantially longer as compared to the temporal delay Tc1 of delay circuit 28. Thus, a signal change occurs at the output of delay circuit 28, which is delayed by the value of the perturbation time Tc1 and then passed to flip-flop 31. The switching states of flip-flop 31 are switched, in turn, into their alternative switching state. This also causes the switching states of multiplexer 25 to change via a signal transmitted by signal line 32. As a result, the input signal 19 now passes through the second signal line 27 through delay circuit 29.

At the beginning of period T3, the input signal 19 returns to the first signal state. The duration in which the input signal stays in the first signal state exceeds the temporal delay Tc2 which is determined by the respective delay circuit 29 in the second signal line 27. Thus, the switching states of flip-flop 31 are switched again into their initial configuration. This also causes the switching states of multiplexer 25 to change via a signal transmitted by signal line 32. As a result, the input signal 19 passes again through the first signal line 26 through delay circuit 28. The following short signal variation in period T3 of input signal 19 is again shorter than the temporal delay Tc1 that is fixed by delay circuit 28 and therefore does not cause a corresponding change of the signal at the output of delay circuit 28.

In this way, the minimum time interval between two variations of the output signal 9 cannot go below the respective perturbation time Tc1, Tc2 of delay circuits 28, 29 and external perturbations in this frequency range are effectively suppressed.

It is to be noted that the invention is not restricted to the embodiments described above which are for purposes of understanding and illustration only and are not to be construed as a limitation of the invention. In particular, the invention has been described by way of example of a specific embodiment of the suppression circuit. As it is known to a skilled person, a multitude of other electronic implementations are possible for the realization of such a circuit suppressing a signal duration lower than the predetermined perturbation time, be it in digital or analog form. For instance, various possibilities for providing the described switching states in the suppression circuit are known in the art, in particular transistors, relays, multiplexers, flip-flops or a software code of a signal processing unit. It is preferred, therefore, that the present invention be limited not by the specific disclosure herein, but only by the appended claims.

What is claimed is:

1. An inductive proximity switch for detecting a presence of an object in a monitored area, the inductive proximity switch comprising:
a coil;
a pulse source configured to supply said coil with transmitting current pulses at a period larger than a duration of said transmitting current pulses; and
a processing circuit configured to generate an output signal based on received voltages varying in dependence on a change of position of the object, said received voltages being induced in said coil after a duration of a transmitting current pulse by the decaying current which previously flows in the object due to the voltage induced therein by said coil,
wherein said received voltages induced in said coil are temporarily shifted from said transmitting current pulses;
a suppression circuit configured to fully suppress a signal duration lower than a predetermined perturbation time in said output signal such that a minimum time interval between two variations of said output signal does not go below said perturbation time;
said processing circuit being configured to generate an intermediate signal from said voltages induced in said coil, said intermediate signal comprising two signal states, and to feed said intermediate signal to said suppression circuit to generate said output signal; and
said suppression circuit comprising at least one delay circuit for delaying the output signal by a duration of said perturbation time for each of said signal states with respect to said intermediate signal.

2. The proximity switch according to claim 1, wherein the first signal state of said intermediate signal indicates the absence of the object from the monitored area, and the second signal state indicates the presence of the object within the monitored area.

3. The proximity switch according to claim 1, wherein a same value of said perturbation time is applied in said suppression circuit for said two signal states.

4. The proximity switch according to claim 1, wherein a different value of said perturbation time is applied in said suppression circuit for said two signal states.

5. The proximity switch according to claim 1, wherein the two signal states of said intermediate signal are distinguished in said suppression circuit by means of at least two switching states of a switching circuit.

6. The proximity switch according to claim 5, wherein said switching circuit comprises at least one multiplexer defining said switching states.

7. The proximity switch according to claim 1, wherein said coil, said pulse source, said processing circuit, and said suppression circuit are arranged in a housing made of a metal, which is not ferromagnetic and which has a specific electric resistance higher than aluminium.

8. The proximity switch according to claim 7, wherein said metal comprises stainless steel.

9. The proximity switch according to claim 1, wherein in a sequence of said transmitting current pulses comprising a preceding current pulse and a succeeding current pulse the polarity of the succeeding current pulse is reversed with respect to the polarity of the preceding current pulse.

10. An arrangement of a proximity switch according to claim 1, further comprising:
a perturbation source,
wherein the perturbation signal producible by said perturbation source comprises a frequency of at most 50 kHz.

* * * * *